United States Patent
Nanjo

(10) Patent No.: US 6,869,830 B2
(45) Date of Patent: Mar. 22, 2005

(54) METHOD OF PROCESSING A SEMICONDUCTOR WAFER

(75) Inventor: Masatoshi Nanjo, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/252,359

(22) Filed: Sep. 24, 2002

(65) Prior Publication Data

US 2003/0102557 A1 Jun. 5, 2003

(30) Foreign Application Priority Data

Dec. 3, 2001 (JP) .......................... 2001-368158

(51) Int. Cl.⁷ .................. H01L 21/44; H01L 21/48; H01L 21/50; H01L 21/301; H01L 21/46
(52) U.S. Cl. ..................................... 438/113; 438/464
(58) Field of Search .................... 438/113, 464

(56) References Cited

U.S. PATENT DOCUMENTS

| 5,071,792 | A | * | 12/1991 | VanVonno et al. ............ 438/17 |
| 5,476,566 | A | | 12/1995 | Cavasin |
| 5,641,714 | A | | 6/1997 | Yamanaka |
| 5,851,664 | A | | 12/1998 | Bennett et al. |
| 5,888,883 | A | * | 3/1999 | Sasaki et al. ............... 438/460 |
| 6,048,749 | A | | 4/2000 | Yamada |
| 6,083,811 | A | | 7/2000 | Riding et al. |
| 6,426,275 | B1 | * | 7/2002 | Arisa ......................... 438/464 |
| 6,465,330 | B1 | * | 10/2002 | Takahashi et al. .......... 438/464 |

FOREIGN PATENT DOCUMENTS

| EP | 0 977 254 | | 2/2000 |
| EP | 0 981 156 | | 2/2000 |
| JP | 05-029455 A | * | 2/1993 |
| JP | 11-204551 A | * | 7/1999 |

* cited by examiner

Primary Examiner—Howard Weiss
(74) Attorney, Agent, or Firm—Smith, Gambrell & Russell, LLP

(57) ABSTRACT

Prior to a grinding step, the front surface of a semiconductor wafer is stuck on a substrate to be mounted on the substrate. The transfer step of mounting the semiconductor wafer on a frame having a mounting opening in its center portion through a mounting tape and removing the substrate from the front surface of the semiconductor wafer is carried out between the grinding step and the subsequent treating step. The substrate is formed of a laminate consisting of a plurality of layers.

10 Claims, 3 Drawing Sheets

METHOD OF PROCESSING A SEMICONDUCTOR WAFER

FIELD OF THE INVENTION

The present invention relates to a method of processing a semiconductor wafer having a large number of rectangular areas defined by streets arranged in a lattice form in its front surface and having a semiconductor circuit in the respective rectangular areas, and to a substrate used in this processing method.

DESCRIPTION OF THE PRIOR ART

As is known to people of ordinary skill in the art, in the production of a semiconductor device, a large number of rectangular areas are defined by streets arranged in a lattice form in the front surface of a semiconductor wafer, and a semiconductor circuit is formed in each of the rectangular areas. The back surface of the semiconductor wafer is ground to reduce its thickness and the semiconductor wafer is cut along the streets to separate the rectangular areas from one another, thereby forming semiconductor chips.

In general, a grinding means is applied to the back surface of the semiconductor wafer to reduce its thickness to a predetermined value and then, a cutting means is applied to the front surface of the semiconductor wafer to cut it along the streets, thereby separating the rectangular areas from one another. When the semiconductor wafer is to be cut along the streets, it is mounted on a frame having a mounting opening in its center portion through a mounting tape so that the rectangular areas separated by cutting can be carried or washed as a unit. More specifically, the mounting tape is affixed to the frame in such a manner that it extends across the mounting opening and it is stuck on the back surface of the semiconductor wafer in the mounting opening, whereby the semiconductor wafer is mounted on the frame. Thereafter, the separated rectangular areas, that is, semiconductor chips are picked up and carried to a predetermined site.

Nowadays, a cutting means is first applied to the front surface of the semiconductor wafer to form grooves having a predetermined depth along the streets and then, a grinding means is applied to the back surface of the semiconductor wafer to reduce the thickness of the semiconductor wafer so that the rectangular areas can be separated from one another due to the existence of the above grooves. In this case, too, when the back surface of the semiconductor wafer is to be ground, it is mounted on a frame having a mounting opening in its center portion through a mounting tape so that the separated rectangular areas can be carried and washed as a unit. More specifically, the mounting tape is affixed to the frame in such a manner that it extends across the mounting opening of the frame and it is stuck on the front surface of the semiconductor wafer in the mounting opening, whereby the semiconductor wafer is mounted on the frame. Thereafter, the separated rectangular areas, that is, semiconductor chips are picked up and carried to a predetermined site.

In order to form very small and lightweight semiconductor chips, it is often desired nowadays that the back surface of the semiconductor wafer be ground to greatly reduce its thickness, for example, to 150 $\mu$m or less, especially 50 $\mu$m or less. For instance, when the thickness of a silicon semiconductor wafer is greatly reduced, the stiffness of the semiconductor wafer becomes very low, thereby making it difficult to grind the semiconductor wafer without damaging it and to carry the ground semiconductor wafer at a predetermined speed. In order to prevent the semiconductor wafer from being damaged by grinding, the semiconductor wafer may be ground by applying the grinding means to the back surface of the semiconductor wafer in a state of a protective substrate or protective tape being stuck on the front surface of the semiconductor wafer. However, when the protective substrate or protective tape is stuck on the front surface of the semiconductor wafer, the semiconductor wafer must be directly accessed from its front surface to carry out treating steps after the step of grinding the back surface of the semiconductor wafer, for example, cutting along the streets, picking up the separated rectangular areas and the like. However, this access is interrupted by the protective substrate or protective tape.

SUMMARY OF THE INVENTION

It is therefore the first object of the present invention to provide a novel and improved method of processing a semiconductor wafer, which enables the back surface of a semiconductor wafer to be ground without damaging it, the semiconductor wafer to be carried fully easily as required and further, the front surface of the semiconductor wafer to be freely accessed after the back surface of the semiconductor wafer is ground, even when the thickness of the semiconductor wafer is to be greatly reduced by grinding the back surface of the semiconductor wafer.

It is the second object of the present invention to provide a substrate which can be advantageously used as a substrate to be stuck on the front surface of a semiconductor wafer to support the semiconductor wafer and can prevent the semiconductor wafer from being damaged without fail when it is removed from the front surface of the semiconductor wafer, in the method of processing a semiconductor wafer which attains the first object.

The inventors of the present invention have conducted intensive studies and as a result, have found that the above first object can be attained by affixing the front surface of a semiconductor wafer on a substrate to mount the semiconductor wafer on the substrate prior to the step of grinding the back surface of the semiconductor wafer, and carrying out a transfer step of mounting the semiconductor wafer on a frame having a mounting opening in its center portion through a mounting tape affixed to the back surface of the semiconductor wafer and removing the substrate from the front surface of the semiconductor wafer between a grinding step and a subsequent treating step of accessing the semiconductor wafer from its front surface to execute a predetermined treatments.

The inventors have further found that the second object can be attained by a substrate formed of a laminate consisting of a plurality of layers.

That is, according to one aspect of the present invention, there is provided a method of processing a semiconductor wafer having a large number of rectangular areas defined by streets arranged in a lattice form in its front surface and having a semiconductor circuit in each of the rectangular areas, comprising:

a mounting step of mounting the semiconductor wafer on a substrate by sticking the front surface of the semiconductor wafer on the substrate;

a grinding step of adsorbing the front surface of the semiconductor wafer to a chuck means through the substrate and grinding the back surface of the semiconductor wafer by applying a grinding means to the back surface of the semiconductor wafer to reduce the thickness of the semiconductor wafer;

a transfer step of mounting a mounting tape on a frame having a mounting opening in its center portion in such a manner that it extends across the mounting opening, sticking the back surface of the semiconductor wafer on the mounting tape to mount the semiconductor wafer in the mounting opening of the frame and removing the substrate from the front surface of the semiconductor wafer after or before the back surface of the semiconductor wafer is stuck on the mounting tape; and a treating step of accessing the semiconductor wafer mounted on the frame from its front surface and executing a predetermined treatment.

In the transfer step, the substrate is preferably removed from the front surface of the semiconductor wafer after the back surface of the semiconductor wafer has been stuck on the mounting tape. Preferably, the substrate is formed of a laminate consisting of a plurality of layers. The laminate consists of a layer having relatively high stiffness and a layer having relatively low stiffness, the front surface of the semiconductor wafer being stuck on the low-stiffness layer side. It is preferred that when the substrate is to be removed from the front surface of the semiconductor wafer, the high-stiffness layer is first removed and then, the low-stiffness layer is removed. It is particularly preferable that the substrate comprises laminated plural high-stiffness layers. The high-stiffness layers may be each a polyethylene terephthalate sheet or film and the low-stiffness layer may be a polyolefin sheet or film. The substrate is larger than the semiconductor wafer and the periphery of the substrate preferably projects 1 to 2 mm beyond the periphery of the semiconductor wafer. In a preferred embodiment of the present invention, the treating step is a cutting step for cutting the semiconductor wafer along the streets by adsorbing the back surface of the semiconductor wafer to a chuck means through the mounting tape and applying a cutting means to the semiconductor wafer from its front surface. In another preferred embodiment, grooves having a predetermined depth are formed along the streets from the front surface of the semiconductor wafer to be mounted on the substrate, and when the semiconductor wafer is ground in the grinding step, the semiconductor wafer is separated into a large number of rectangular areas and the treating step is a pick-up step for picking up the individually separated rectangular areas individually. In the grinding step, the thickness of the semiconductor wafer can be reduced to 150 $\mu$m or less.

According to another aspect of the present invention, there is provided a substrate for semiconductor wafers, which is formed of a laminate consisting of a plurality of layers.

It is preferred that the laminate consists of a layer having relatively high stiffness and a layer having relatively low stiffness, and the semiconductor wafer is stuck on the low-stiffness layer side. Preferably, the laminate comprises a plurality of high-stiffness layers. The high-stiffness layers may be each a polyethylene terephthalate sheet or film and the low-stiffness layer may be a polyolefin sheet or film. It is preferred that the substrate is larger than the semiconductor wafer and the periphery of the substrate projects 1 to 2 mm beyond the periphery of the semiconductor wafer when the semiconductor wafer is positioned on the substrate.

DETAILED DESCRIPTION OF THE PREFERRED EMBODIMENTS

Preferred Embodiments of the semiconductor wafer processing method and the substrate used in the method of the present invention will be described in detail with reference to the accompanying drawings.

Figure 1:
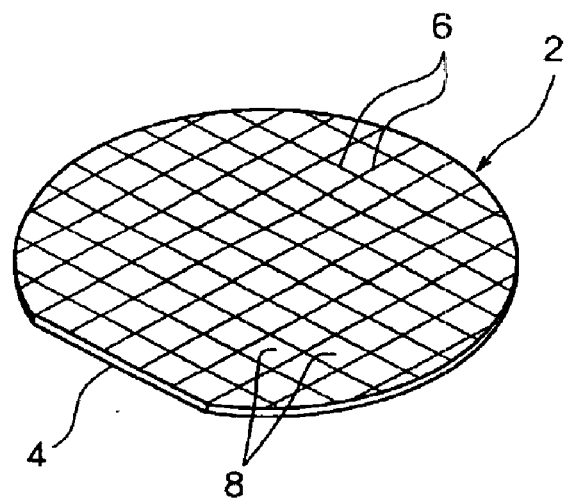
FIG. 1 is a perspective view of a typical example of a semiconductor wafer to which the processing method of the present invention is applied.

FIG. 1 shows a typical example of a semiconductor wafer to which the processing method of the present invention can be applied. The illustrated semiconductor wafer 2 has a shape like a disk having a linear edge 4 called "orientation flat" in part of its periphery and has a large number of rectangular areas 8 defined by streets 6 arranged in a lattice form in its front surface. A semiconductor circuit is formed in each of the rectangular areas.

Figure 2:
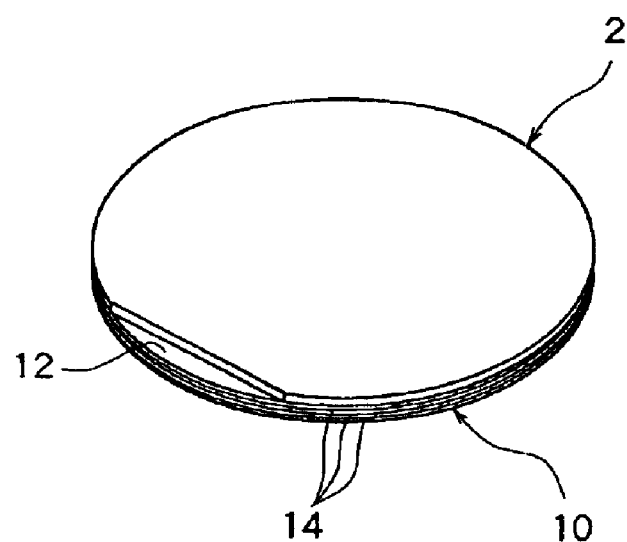
FIG. 2 is a perspective view showing a state in which the semiconductor wafer is mounted on a substrate in the mounting step of the processing method of the present invention.
Figure 3:
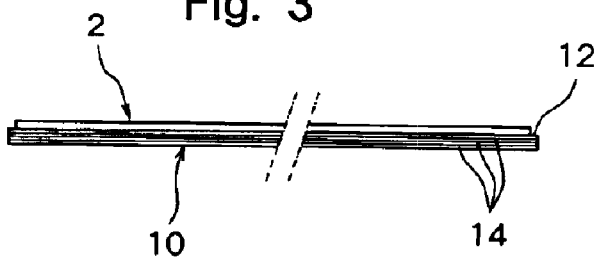
FIG. 3 is a side view showing a state in which the semiconductor wafer is mounted on the substrate in the mounting step of the processing method of the present invention.

A mounting step is carried out in the processing method of the present invention. In this mounting step, as shown in FIG. 2 and FIG. 3, the semiconductor wafer 2 is mounted on a substrate 10 by sticking the front surface of the semiconductor wafer 2 on the substrate 10. The substrate 10 may have a disk-like shape or a shape similar in shape to the semiconductor wafer 2, with a linear edge corresponding to the linear edge 4 of the semiconductor wafer 2.

Preferably, the substrate 10 is slightly larger than the semiconductor wafer 2 and the periphery of the substrate 10 projects beyond the periphery of the semiconductor wafer 2. The length of the projection of the periphery of the substrate 10 beyond the periphery of the semiconductor wafer 2 is about 1 to 2 mm. When the substrate 10 has a disk-like shape and the semiconductor wafer 2 has the linear edge 34, the periphery of the substrate 10 projects 1 to 2 mm beyond the periphery of the semiconductor wafer 2 in a portion excluding the linear edge 4 and the length of the projection of the periphery of the substrate 10 in a portion corresponding to the linear edge 4 is preferably larger than 1 to 2 mm (in this specification, the length of the projection of the periphery of the substrate 10 means the length of the projection of the periphery of the substrate 10 excluding a portion corresponding to the linear edge of the semiconductor wafer 2 when the semiconductor wafer 2 has the linear edge 4). In the processing of the semiconductor wafer 2, a plurality of semiconductor wafers 2 are held in a cassette that is not shown. More specifically, the semiconductor wafers 2 are stored in a plurality of storage grooves formed at regular intervals in a vertical direction in the side wall of the cassette and carried in most cases. When the semiconductor wafer 2 is very thin (for example, 50 μm or less) and the edge of the semiconductor wafer 2 comes into contact with the bottom surface and the like of the storage groove, the semiconductor wafer 2 has a frequent possibility of being damaged. Therefore, when the periphery of the substrate 10 mounting the semiconductor wafer 2 projects beyond the periphery of the semiconductor wafer 2, the direct contact of the periphery of the semiconductor wafer 2 with the bottom and the like of the storage groove is prevented without fail, thereby avoiding the damage of the semiconductor wafer 2. When the substrate 10 is excessively large and its periphery projects too much, however, the substrate 10 mounting the semiconductor wafer 2 cannot be stored in the storage groove of the cassette having a standard size. Further, when the substrate 10 is slightly larger than the semiconductor wafer 2 and the periphery of the substrate 10 projects beyond the periphery of the semiconductor wafer 2, according to the experience of the inventors, the possibility of producing chippings around the periphery of the semiconductor wafer 2 at the time of grinding the back surface of the semiconductor wafer 2 as will be described later is greatly reduced and the operation of removing the semiconductor wafer 2 from the substrate 10 as will be described later becomes considerably easy, although the reason for these is not made clear.

It is preferred that the substrate 10 be formed of a laminate consisting of a plurality of layers, especially a laminate composed of a layer having relatively low stiffness and a layer having relatively high stiffness, and the semiconductor wafer 2 be stuck on the low-stiffness layer side. Particularly preferably, the high-stiff layer comprises a plurality of layers. In the illustrated embodiment, the substrate 10 is a laminate consisting of a low-stiffness layer 12 at the topmost position and three high-stiffness layers 14 underlying the low-stiffness layer 12. The low-stiffness layer 12 may be a polyolefin sheet or film and the high-stiffness layers 14 may be a polyethylene terephthalate sheet or film. The low-stiffness layer 12 and the three high-stiffness layers 14 are stuck together by an adhesive. The adhesive is advantageously an ultraviolet curing adhesive which is cured by exposure to ultraviolet radiation to lose or reduce its tackiness or a heat curing adhesive which is cured by heating to lose or reduce its tackiness. An adhesive for which the ultraviolet curing or heat curing adhesive is advantageously used is applied also on the top surface of the low-stiffness layer 12 and hence, the front surface of the semiconductor wafer 2 is stuck on the top surface of the low-stiffness layer 12 by the adhesive. Thus, the semiconductor wafer 2 is mounted on the substrate 10 in a state that its front surface faces down, that is, its back surface faces up.

Figure 4:
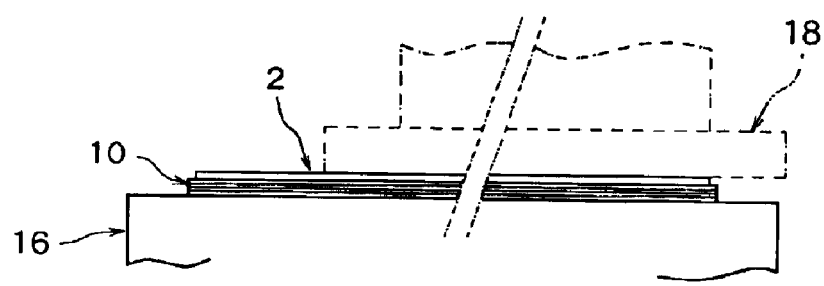
FIG. 4 is a schematic side view showing the grinding step in the processing method of the present invention.

Subsequently, a grinding step is carried out. With reference to FIG. 4, a chuck means 16 including a porous chuck plate is used in this grinding step. This chuck means 16 has a slightly larger outer diameter than the outer diameter of the substrate 10, and the substrate 10 and the semiconductor wafer 2 mounted on the substrate 10 are placed on the chuck means 16. The chuck means 16 is communicated with a vacuum source to adsorb the back surface of the semiconductor wafer 2 onto the chuck means 16 through the substrate 10. The grinding means 18 is applied to the back surface of the semiconductor wafer 2 to grind it so as to reduce its thickness to a predetermined value. The grinding means 18 is an annular grinding tool having a grinding piece containing diamond particles on its lower surface. In grinding the back surface of the semiconductor wafer 2, the chuck means 16 holding the semiconductor wafer 2 is rotated on its center axis and the grinding means 18 is also rotated on its center axis, and the grinding means 18 is pressed against the back surface of the semiconductor wafer 2. In this grinding step, since the semiconductor wafer 2 is reinforced with the substrate 10 stuck on the front surface of the semiconductor wafer 2, it is possible to grind the semiconductor wafer 2 to a thickness of, for example, 150 μm or less, especially 50 μm or less, without causing a problem such as damage to the semiconductor wafer 2. The grinding of the back surface of the semiconductor wafer 2 as described above can be advantageously carried out by using a grinder marketed under the trade name of 'DFG841' by Disco Co., Ltd., for example. When the above grinder is used, a plurality of the semiconductor wafers 2 mounted on the substrates 10 can be held in a cassette (not shown) known per se at regular intervals in the vertical direction so as to be supplied to the grinder.

Figure 5:
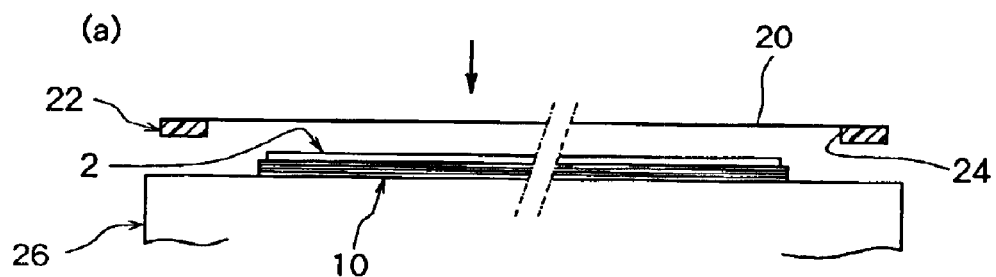
FIGS. 5(a) and 5(b) are schematic sectional views showing the transfer step in the processing method of the present invention.
Figure 5:
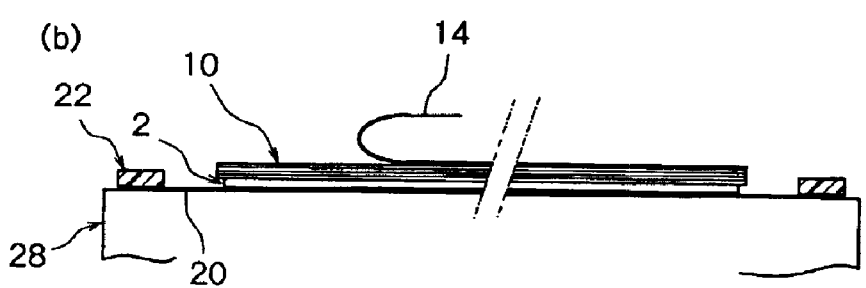
Figure 6:
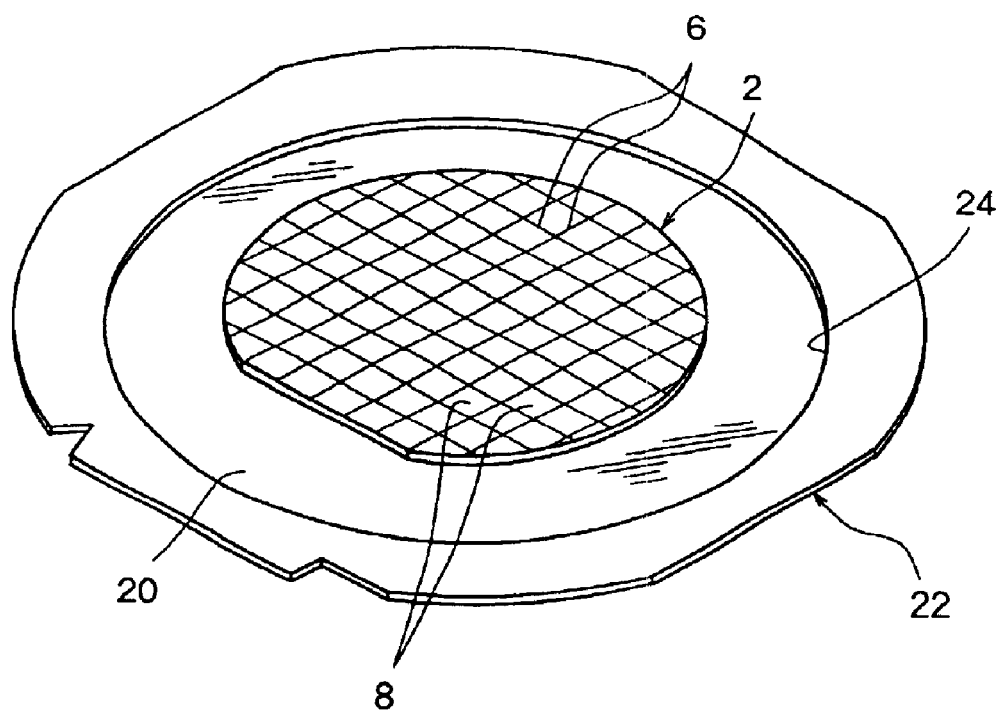
FIG. 6 is a perspective view showing a state in which the semiconductor wafer is mounted on a frame through a mounting tape, after the transfer step in the processing method of the present invention.

In the processing method of the present invention, it is important to carry out a transfer step subsequent to the grinding step. In the transfer step shown in FIGS. 5(a) and 5(b), the semiconductor wafer 2 is first mounted on a frame 22 through a mounting tape 20. The frame 22 is an annular member that can be made from a suitable synthetic resin or metal and has an annular mounting opening 24 in its center portion. The mounting tape 20 can be formed of a suitable synthetic resin sheet or film, and an adhesive, for which an ultraviolet curing adhesive or heat curing adhesive is advantageously used, is applied on its one side, i.e., on its lower side so that the mounting tape 20 can be stuck on one side, that is, on the top side of the frame 22 by the adhesive. As shown in FIG. 5(a), the frame 22 to which the mounting tape 20 is affixed is brought down toward the semiconductor wafer 2 placed on a table 26 (this table 26 may be constituted by the chuck means 16 shown in FIG. 4 or by a support member separately from the chuck means 16) so that the semiconductor wafer 2 is positioned in the mounting opening 24 of the frame 22. The lower surface of the mounting tape 20 is then stuck on the back surface of the semiconductor wafer 2. Thereafter, the substrate 10, semiconductor wafer 2, frame 22 and mounting tape 20 positioned in the mentioned order from the bottom to the top are turned upside down so that the mounting tape 20, frame 22, semiconductor wafer 2 and substrate 10 are arranged in this order from the bottom to the top, and this assembly is placed on an appropriate table 28. The substrate 10 is exposed to ultraviolet radiation or heated to cure the adhesive existent between the substrate 10 and the surface of the semiconductor wafer 2 and the adhesive existent between adjacent layers of the substrate 10 to lose or reduce their tackiness. Then, one end of each of the layers constituting the substrate 10, that is, the low-stiffness layer 12 and the three high-stiffness layers 14 is pulled toward the other end one by one to remove them in order of precedence. In other words, in the state of FIG. 5(b), the topmost high-stiffness layer 14 is first peeled off, followed by the second high-stiffness layer 14, the third high-stiffness layer 14 and the low-stiffness layer 12, thereby removing the substrate 10 from the front surface of the semiconductor wafer 2. Consequently, the semiconductor wafer 2 is changed from a state of it being mounted on the substrate 10 with its front surface stuck on the substrate 10 to a state of it being mounted on the frame 22 with its back surface stuck on the mounting tape 20. FIG. 6 shows the semiconductor wafer 2 which is mounted on the frame 22 through the mounting tape 20 in a state of its front surface facing up.

By the way, the following facts should be noted for the substrate 10 used in the illustrated embodiment. That is, the substrate 10 is a laminate consisting of the low-stiffness layer 12 and the high-stiffness layers 14. Therefore, even when the high-stiffness layer 14 has relatively low stiffness, the laminate as a whole has considerably high stiffness. The low-stiffness layer 12 serves as a "buffer" material to protect the surface of the semiconductor wafer 2 from external force. Therefore, even when the semiconductor wafer 2 is ground in the manner shown in FIG. 4 until its thickness becomes 150 μm or less, especially 50 μm or less, it can be ground fully well without being damaged as it is fully reinforced with the substrate 10. On the other hand, to remove the substrate 10 from the front surface of the semiconductor wafer 2, the whole substrate 10 is not removed at a time but the three high-stiffness layers 14 are removed one by one and then, the low-stiffness layer 12 is removed, as described above. Accordingly, when the substrate 10 is removed from the front surface of the semiconductor wafer 2, the generation of excessive stress in the semiconductor wafer 2 can be avoided. In addition, when the high-stiffness layers 14 having relatively high stiffness are removed, the low-stiffness layer 12 existent between the high-stiffness layer 14 and the front surface of the semiconductor wafer 2 functions as a so-called buffer material to reduce stress produced in the semiconductor wafer 2. Thus, the substrate 10 can be removed from the front surface of the semiconductor wafer 2 without the possibility of damaging the semiconductor wafer 2 by producing excessive stress in the semiconductor wafer 2. When the substrate 10 having considerably high stiffness as a whole is to be removed from the front surface of the semiconductor wafer 2 at a time, however, there is a possibility that the semiconductor wafer 2 may be damaged by considerable stress produced in the semiconductor wafer 2.

Figure 7:
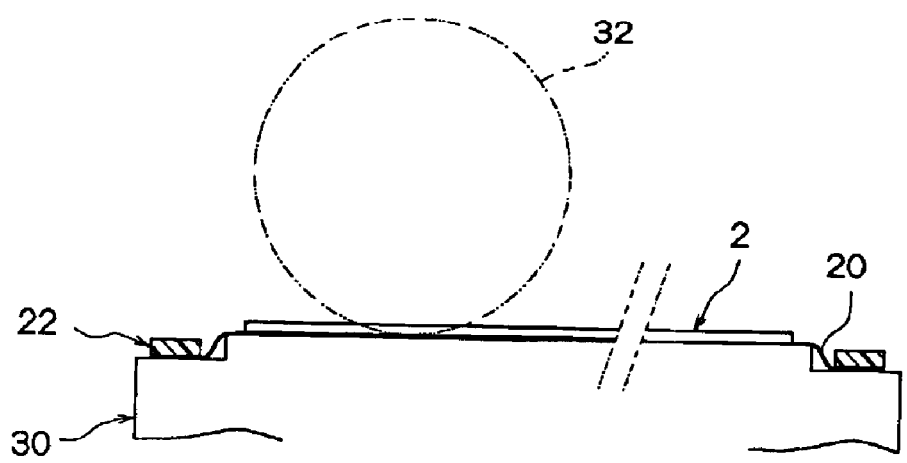
FIG. 7 is a schematic sectional view showing the cutting step (treating step) in the processing method of the present invention.

After completion of the above transfer step, a treating step is carried out by accessing the semiconductor wafer 2 from its front surface to execute a predetermined treatment. In the illustrated embodiment, as shown in FIG. 7, the back surface of the semiconductor wafer 2 is adsorbed to a chuck means 30 through the mounting tape 20, and a cutting means 32 is applied to the front surface of the semiconductor wafer 2 to cut the semiconductor wafer 2 along the streets 6. The chuck means 30 comprises a porous chuck plate which is communicated with a vacuum source to attract the back surface of the semiconductor wafer 2 through the mounting tape 20. The cutting means 32 can be advantageously constituted by a thin, disk-like blade that can be formed by binding diamond abrasive grains with a suitable binder. By moving the chuck means 30 and the cutting means 32 along the streets 6 relative to each other while the cutting means 32 is rotated on its center axis at a high speed, the semiconductor wafer 2 is cut along the streets 6 to separate the rectangular areas 8 from one another. The mounting tape 20 is kept uncut and hence, even when the rectangular areas 8 are separated from one another, they remain still stuck on the mounting tape 20 on their back surfaces and kept held on the frame 22. After the cutting step is carried out, the separated rectangular areas 8 are washed, individually picked up and carried to a predetermined site. The cutting of the semiconductor wafer 2 as described above can be advantageously carried out by a cutting machine (also called "dicer") marketed by Disco Co., Ltd. under the trade name of DFD641. Even when this type of cutting machine is used, a plurality of semiconductor wafers 2 mounted on the frames 22 through the mounting tapes 20 and stored in a cassette known per se (not shown) at regular intervals in the vertical direction can be supplied to the cutting machine.

In the illustrated embodiment, after the thickness of the semiconductor wafer 2 has been reduced to a predetermined value by grinding the back surface of the semiconductor wafer 2, the semiconductor wafer 2 is cut along the streets 6. Optionally, prior to the grinding step shown in FIG. 4, grooves having a predetermined depth may be engraved in the front surface of the semiconductor wafer 2 along the streets 6 (the grooves may be engraved by a cutting step similar to the cutting step explained with reference to FIG. 7). In this case, when the back surface of the semiconductor wafer 2 is ground to reduce its thickness in the grinding step shown in FIG. 4, the semiconductor wafer 2 is separated into rectangular areas 8 due to the existence of the above grooves, and the separated rectangular areas 8 remain kept mounted on the substrate 10. When the transfer step explained with reference to FIGS. 5(a) and 5(b) is carried out, there is established a state in which the individually separated rectangular areas 8 are each mounted on the frame 22 through the mounting tape 20. In this case, a pick-up step known per se for picking up the individually separated rectangular areas 8 individually and carrying them to a predetermined site (for example, a table for mounting the rectangular areas 8) may be employed as the treating step to be carried out after the transfer step.

While preferred embodiments of the present invention have been described in detail with reference to the accompanying drawings, it should be understood that the present invention is not limited thereto and various changes and modifications may be made therein without departing from the spirit and scope of the present invention.

What is claimed is:

1. A method of processing a semiconductor wafer having a large number of rectangular areas defined by streets arranged in a lattice form in its front surface and having semiconductor circuits in the respective rectangular areas, comprising:

a mounting step of mounting the semiconductor wafer on a substrate by sticking the front surface of the semiconductor wafer on the substrate, wherein the substrate is larger than the semiconductor wafer and the periphery of the substrate projects beyond the periphery of the semiconductor wafer;

a grinding step of adsorbing the front surface of the semiconductor wafer to a chuck means through the substrate and grinding the back surface of the semiconductor wafer by applying a grinding means to the back surface of the semiconductor wafer to reduce the thickness of the semiconductor wafer;

a transfer step of mounting a mounting tape on a frame having a mounting opening in its center portion in such a manner that it extends across the mounting opening, sticking the back surface of the semiconductor wafer on the mounting tape to mount the semiconductor wafer in the mounting opening of the frame and removing the substrate from the front surface of the semiconductor wafer after or before the back surface of the semiconductor wafer is stuck on the mounting tape; and a treating step of accessing the semiconductor wafer mounted on the frame from its front surface and executing a predetermined treatment.

2. The method of processing a semiconductor wafer according to claim 1, wherein the substrate is removed from the front surface of the semiconductor wafer after the back surface of the semiconductor wafer has been stuck on the mounting tape in the transfer step.

3. The method of processing a semiconductor wafer according to claim 1, wherein the substrate is formed of a laminate consisting of a plurality of layers.

4. The method of processing a semiconductor wafer according to claim 3, wherein the substrate is formed of a laminate consisting of a layer having relatively high stiffness and a layer having relatively low stiffness, the front surface of the semiconductor wafer being stuck on the low-stiffness layer side, and when the substrate is to be removed from the front surface of the semiconductor wafer, the high-stiffness layer is first removed and then the low-stiffness layer is removed.

5. The method of processing a semiconductor wafer according to claim 4, wherein the substrate comprises laminated plural high-stiffness layers.

6. The method of processing a semiconductor wafer according to claim 4, wherein the high-stiffness layers are each a polyethylene terephthalate sheet or film and the low-stiffness layer is a polyolefin sheet or film.

7. The method of processing a semiconductor wafer according to claim 1, wherein the periphery of the substrate projects 1 to 2 mm beyond the periphery of the semiconductor wafer.

8. The method of processing a semiconductor wafer according to claim 1, wherein the treating step is a cutting step for adsorbing the back surface of the semiconductor wafer to a chuck means through the mounting tape and applying a cutting means to the front surface of the semiconductor wafer to cut the semiconductor wafer along the streets.

9. The method of processing a semiconductor wafer according to claim 1, wherein grooves having a predetermined depth are formed along the streets from the front surface of the semiconductor wafer to be mounted on the substrate, and when the semiconductor wafer is ground in the grinding step, the semiconductor wafer is separated into a large number of rectangular areas, and the treating step is a pick-up step for picking up the individually separated rectangular areas individually.

10. The method of processing a semiconductor wafer according to claim 1, wherein the thickness of the semiconductor wafer is reduced to 150 $\mu$m or less in the grinding step.

* * * * *